United States Patent [19]

Fenk

[11] 4,314,152
[45] Feb. 2, 1982

[54] MONOLITHICALLY INTEGRABLE SEMICONDUCTOR CIRCUIT WITH AN AMPLIFIER CONTROLLED BY A PHOTO DIODE

[75] Inventor: Josef Fenk, Ottenburg, Fed. Rep. of Germany

[73] Assignee: Siemens Aktiengesellschaft, Berlin and Munich, Fed. Rep. of Germany

[21] Appl. No.: 115,255

[22] Filed: Jan. 25, 1980

[30] Foreign Application Priority Data

Feb. 5, 1979 [DE] Fed. Rep. of Germany ....... 2904316

[51] Int. Cl.³ ............................................. H01J 40/14
[52] U.S. Cl. .............................. 250/214 A; 250/214 R
[58] Field of Search ........................ 250/214 R, 214 A; 330/59, 308

[56] References Cited

PUBLICATIONS

"Elektronik", (1976), H. 1, pp. 53-56.

*Primary Examiner*—David C. Nelms
*Assistant Examiner*—Darwin R. Hostetter
*Attorney, Agent, or Firm*—Herbert L. Lerner; Laurence A. Greenberg

[57] ABSTRACT

Monolithically integrable semiconductor circuit with an amplifier controlled by a photo diode, including a differential amplifier having inverting and noninverting inputs and outputs and a photo diode having a first and a second lead, the first lead of the photo diode being connected in the blocking direction to the inverting input of the differential amplifier, and the noninverting input of the differential amplifier being connected to a reference potential, a coupling resistor connected between the inverting and noninverting inputs of the differential amplifier, a filter circuit and a transistor amplifier being connected in a feedback branch between the noninverting output and the inverting input of the differential amplifier, and the inverting output of the differential amplifier and the second lead of the photo diode being connected to ground.

10 Claims, 3 Drawing Figures

MONOLITHICALLY INTEGRABLE SEMICONDUCTOR CIRCUIT WITH AN AMPLIFIER CONTROLLED BY A PHOTO DIODE

The invention relates to a monolithically integrable semiconductor circuit with an amplifier controlled by a photo diode.

Such semiconductor circuits are known in the art. In this connection, the following can be stated: In order to obtain a large useful signal component, photo diodes work with a large load impedance, which can be in the form of an ohmic resistor or a resonant circuit. If a resonant circuit is used, the photo current is not limited. The tuned circuit forming the resonant circuit can be constructed for high resonance impedances and the parasitic diode capacity can be included in the tuned circuit.

If, on the other hand, a high-resistance resistor is taken as the load, then the limitation of the useful photo current, which must be provided if a constant d-c light source of high radiation intensity is effective, and the parasitic diode capacity, are troublesome. Circuit arrangements with positive capacitive and inductive voltage feed-back are known for reducing parasitic diode capacities. If, in order to obtain large useful signal components, very high load impedances are selected, a very large photo current occurs in case of high-intensity illumination by d-c light, so that the diode blocking voltage becomes substantially smaller and a limitation of the photo current takes place under some conditions. This leads to a reduction of the useful signal current and of the ultimate sensitivity of the circuit.

It is accordingly an object of the invention to provide a monolithically integrable semiconductor circuit with an amplifier controlled by a photo diode, which overcomes the hereinaforementioned disadvantages of the heretofore known devices of this general type, and which:

1. does not lead to a limitation of the photo current if the maximum d-c light irradiation intensity occurs, due to the low d-c resistance; and which 2. contains positive voltage feedback which, through cancellation of the parasitic diode capacity, increases the useful cutoff frequency or the permissible load impedance, respectively; and 3. in addition a reduction of the a-c light photo current limitation due to the d-c light with, at the same time, large useful a-c light impedances for the a-c photo current, and a reduction of the influence of the parasitic diode capacity are intended.

With the foregoing and other objects in view there is provided, in accordance with the invention, a monolithically integrable semiconductor circuit with an amplifier controlled by a photo diode, comprising a differential amplifier having inverting and noninverting inputs and outputs and a photo diode having a first and a second lead, the first lead of the photo diode being connected in the blocking direction to the inverting input of the differential amplifier, and the noninverting input of the differential amplifier being connected to a reference potential, a coupling resistor connected between the inverting and noninverting inputs of the differential amplifier, a filter circuit and a transistor amplifier being connected in a feedback branch between the noninverting output and the inverting input of the differential amplifier, and the inverting output of the differential amplifier and the second lead of the photo diode being connected to ground.

With such an amplifier circuit, there are permitted sufficiently large load resistors without a limitation of the photo current coming about, and a cancellation of at least part of the disturbing capacity of the photo diode. In the circuit just described, the noninverting input of a differential stage is therefore connected to a reference voltage $U_r$. The inverting input is connected to a summing point. To this summing point are connected the photo diode, operated in the blocking direction; a load resistance; and the high-impedance collector output of a transistor provided in the differential amplifier. The transistor forms part of a control loop which includes the differential stage, the filter circuit and the transistor. This control circuit acts in the manner of an operational amplifier connected as a voltage follower. Therefore, a voltage corresponding to the reference voltage $U_r$ appears at the summing point. Thereby, a very low impedance is obtained for all frequencies within the transmission range of the filter circuit. For all frequencies outside the passband of the filter circuit, the impedance at the summing point increases inversely proportionally to the decrease of the loop gain. If the transmission frequency is far outside the passband of the filter circuit, very high load impedances can be adjusted and thereby large useful signal voltages as well. In this way, the signal-to-noise ratio at the second differential stage is maximized, i.e., at the noninverting output of the differential stage, which is simultaneously the signal output of the circuit. An external resistor or a resonant circuit can be used as the load impedance for the useful signal. Cancellation of the diode capacity is achieved by connecting a relatively small resistor in series with the anode of the photo diode. Through positive voltage feedback, the same voltage appears thereat, as at the cathode of the photo diode. The charge of the parasitic diode capacity therefore does not need to be reversed, so that its influence is reduced substantially.

In accordance with another feature of the invention, there is provided a resistor connected between the inverting output of the differential amplifier and ground, and a resistor connected between the second lead of the photo diode and ground.

In accordance with a further feature of the invention, the filter circuit causes an attenuation in the feedback branch which is greater than the gain of the differential and transistor amplifiers disposed in the branch, for all useful signal frequencies.

In accordance with an additional feature of the invention, the filter circuit is a lowpass filter.

In accordance with an added feature of the invention, the filter is a two-section lowpass filter.

In accordance with yet another feature of the invention, the filter circuit is a band rejection filter with a rejection frequency corresponding to the transmission frequency.

In accordance with yet a further feature of the invention, there is provided an amplifier circuit, the anode of the photo diode being connected to the output of the amplifier circuit and the cathode of the photo diode being connected to the input of the amplifier circuit.

In accordance with yet an added feature of the invention, the amplifier circuit comprises identical first and second bipolar transistors of a given type, a third bipolar transistor of opposite type to the first and second transistors, a first and second current supply, and a current mirror amplifier, the cathode of the photo diode being connected to the base of the first transistor, the collector of the first transistor being connected to ground, the emitter of the first transistor being connected to the first current supply and to the base of the second transistor, the emitter of the second transistor being connected to the second current supply and to the base of the third transistor, the collector of the third transistor being connected to a control input of the current mirror amplifier, an output of the current mirror amplifier being fed back to the anode of the photo diode, and including a resistor connected between the emitter of the third transistor and the noninverting input of the differential amplifier.

In accordance with yet an additional feature of the invention, there is provided an integrated circuit having a substrate and an epitaxial layer, the epitaxial layer containing the photo diode and having a conduction type opposite to that of the substrate, the emitter of the first transistor being connected antiparallel to the photo diode, having the same conduction type as the substrate, and the integrated circuit having no further pn-junction between the pn-junction between the substrate and epitaxial layer and the pn-junction of the photo diode.

In accordance with a concomitant feature of the invention, the resistor connected between the second lead of the photo diode and ground has a lower resistance than the coupling resistor.

Other features which are considered as characteristic for the invention are set forth in the appended claims.

Although the invention is illustrated and described herein as embodied in a monolithically integrable semiconductor circuit with an amplifier controlled by a photo diode, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which.

Figures 1, 3:
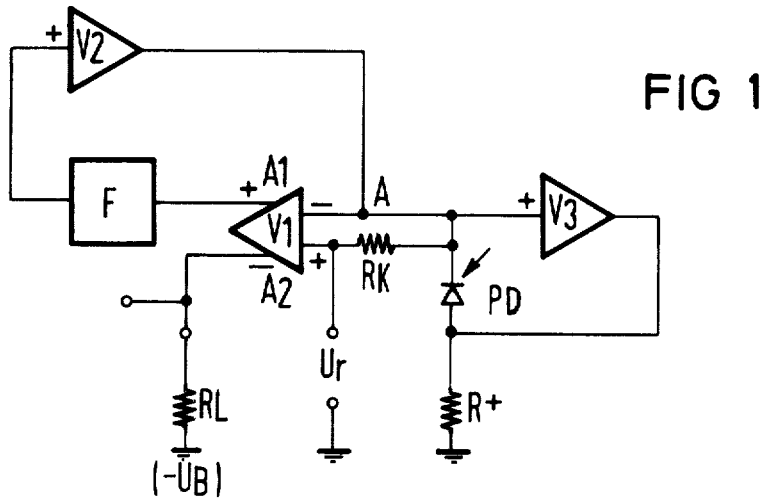
FIG. 1 is a basic schematic circuit diagram of a device according to the invention, including an additional circuit portion.
FIG. 3 is a diagrammatic fragmentary view of the layout of an integrated photo diode.

Referring now to the figures of the drawing and first particularly to FIG. 1 thereof, there is seen a circuit having a differential amplifier $V_1$ forming the difference stage, the non-inverting input "+" of which is connected to a reference voltage $U_r$. Since the noninverting output $A_1$ of the differential amplifier $V_1$ is fed back to the inverting input of the differential amplifier $V_1$ through a filter circuit F and a transistor amplifier $V_2$ and since, in addition, the cathode of the photo cathode PD is likewise connected to the respective input of the differential amplifier $V_1$, a circuit node serving as the summing point A is obtained in this manner.

In addition, the noninverting input "−" of the differential amplifier $V_1$ is connected to a reference potential relative to ground, so that a reference voltage $U_r$ exists between ground and the hereinafore mentioned input "−" of the differential amplifier $V_1$.

Due to this voltage application and the transistor amplifier $V_2$ following the filter circuit F, a control characteristic of the circuit is accordingly provided which is to be supplemented only by the load impedance $R^+$ that is connected between the anode of the photo diode PD and ground, i.e., the reference potential. It should be noted expressly that the potential at the anode of the photo diode PD, which is determined at the noninverting input "+" of the differential amplifier $V_1$, is to be chosen relative to the reference potential at ground in such a manner that the diode is permanently connected in the blocking direction by the bias caused thereby.

In order to obtain the best possible effect with respect to avoiding a limitation of the photo current if maximum d-c light irradiation intensities occur, it is advisable in any event to choose the filter circuit F in such a manner that the attenuation outside the useful signal frequencies is a minimum and that within the useful signal frequencies, the attenuation caused by it for the chosen transmission frequency f is designed larger than the total gain caused by the two amplifiers in the feedback branch, i.e., the differential amplifier $V_1$ and the second amplifier $V_2$ (which in the simplest case is represented by a simple transistor).

It is further advisable, especially in the interest of reducing the parasitic capacity of the photo diode PD to a large extent, to connect the anode of the photo diode PD to the output, and the cathode thereof to the high-impedance input, of a further amplifier or amplifier circuit $V_3$, as is shown in FIG. 1.

This measure is important particularly if the integrated circuit including the photo diode PD is produced in an epitaxial layer which is deposited on a semiconductor substrate of the opposite conduction type.

Figure 2:
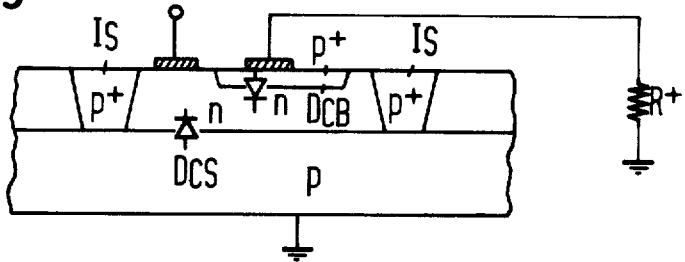
FIG. 2 is a supplemental circuit to further reduce the parasitic diode capacity.

In that case, the amplifier circuit seen in FIG. 2 is particularly advantageous. In the FIG. 2 circuit, the cathode of the photo diode PD operating in the blocking direction is connected to the base of a first bipolar transistor $T_1$ of one type. The collector of the transistor $T_1$ is connected to a common reference potential, i.e., to ground, while its emitter is controlled by a first current supply $S_1$, i.e., a current supply transistor. The emitter of the transistor $T_1$ is further connected to the base of a second bipolar transistor $T_2$, which is identical to the transistor $T_1$.

The collector of the second bipolar transistor $T_2$ is likewise connected to ground, while its emitter is again connected to a current supply transistor $S_2$ and also to the base of a third bipolar transistor $T_3$.

The third bipolar transistor $T_3$ is of a type which is opposite to that of the transistors $T_1$ and $T_2$ and is also connected differently from the two transistors $T_1$ and $T_2$ with respect to its emitter and its collector. As can be seen from FIG. 2, the emitter of the transistor $T_3$ is connected through a series resistor $R++$ to the noninverting input "+" of the differential amplifier $V_1$ or to the reference potential $U_r$, which is the equivalent. The collector of the transistor $T_3$ controls a current-mirroring amplifier $V_4$ which is of a known type.

The current-mirroring amplifier $V_4$ includes three bipolar transistors of the same type as the first two transistors $T_1$ and $T_2$ of the amplifier circuit shown in FIG. 2. Two of these transistors, i.e., the transistors $T_5$ and $T_6$, are connected together by way of their base leads and are connected by their emitters through equal series resistors R to the supply potential $+U_B$. These first two transistors $T_5$ and $T_6$ are further controlled in an aiding fashion by the emitter of the third transistor T₄ of the amplifier V₄. The base of the transistor T₄ is connected to the collector of the transistor T₃ and the collector of the transistor T₄ is further connected to ground.

The circuit of the current supply transistors S₁ and S₂ corresponds to that of the transistors T₅ and T₆ of the current mirror with respect to the emitter and collector connections; they are also of the same type as the latter. Furthermore, their base terminals are acted upon by a common bias.

On the basis of the hereinafore described circuit shown in FIG. 1, the circuit components participating in the feedback loop, i.e., the differential amplifier V₁, the filter circuit F and the transistor amplifier V₂, form a control loop in the same manner as an operational amplifier connected as a voltage follower. Therefore, a potential according to the reference potential $U_r$ adjusts itself at the summing point A. In this way, a very low impedance is obtained at the summing point A for all frequencies in the bandpass width of the filter F. For all frequencies outside the bandpass range, the impedance increases inversely proportionally to the decrease of the loop gain. If the signal frequency is far outside the pass band of the filter circuit F, very high load impedances $R_K$ can be set.

The filter circuit can be constructed, for instance, as a lowpass filter, and particularly as a two-section lowpass filter F. Another advantageous arrangement of the filter circuit F would be a band rejection filter with a rejection frequency corresponding to the transmission frequency. If, for instance, the transmission frequency is 30 kHz, the filter circuit will be constructed, for instance, as a lowpass with a cut-off frequency of less than 3.0 kHz or as a band rejection filter with a rejection frequency of 30 kHz. Active as well as passive filter circuits can be used.

If the circuit is realized using monolithically integrated semiconductor technology, the filter circuit F will advantageously be used as a lowpass in the form of a filter with integrated capacities. The useful signal current can be taken off at the output A₂ of the differential amplifier V₁, as is evident from FIG. 1. The gain obtained can be calculated as the product of the resultant transconductance of the differential amplifier V₁ and the external load impedance.

If the amplifier V₃ is provided with a voltage gain of 1, then the charge of the parasitic diode capacity is not reversed, since the coupling impedance $R_K$ acts as the load impedance, and its influence is thereby reduced substantially. So as not to obtain a limitation of the photo diode current at high d-c light irradiation intensities of the photo diode PD, the resistance R+ which connects the photo diode PD to the reference potential, i.e., to ground, is chosen to be substantially smaller than the resistance $R_K$ which connects the inverting input of V₁, i.e. the input of the circuit V₁, to the reference potential ($U_r$).

The photo diode PD is usually constructed in the integrated circuit in the manner shown in FIG. 3.

An n-doped epitaxial layer of the same semiconductor material is produced on a wafer-shaped single-crystal substrate of silicon. The individual components of the monolithically integrated semiconductor circuit are then generated therein. The components are optionally separated by highly doped insulating zones IS having the same conduction type as the substrate. For the photo diode PD, this has the consequence that two parasitic capacities must be taken into consideration, namely the capacity of the pn-junction in the cut-off direction, i.e., the capacity of the diode $D_{CB}$, as well as the capacity of the substrate diode $D_{CS}$.

The embodiment of the amplifier V₃ which serves to reduce the parasitic diode capacities and is shown in FIG. 2, is eminently well suited for solving this problem in conjunction with the other measures of the invention. This is due to the fact that in series with the diode $D_{CB}$, represented by the pn-junction of the photo diode PD, the coupling resistor R+ is connected to ground, so that the signal arrives at the base of the transistor T₃ by way of the transistors T₁ and T₂. The resistor R++ is connected between the emitter of the transistor T₃ and the reference potential $U_r$. With a voltage gain having the value 1, there is obtained in approximation for the resistor R++ the value $$R^{++} = R^+ - \gamma e_{T3} \text{ with } \gamma e_{T3} = U_T/I_{ET3},$$

where R+ is the resistance between the anode of PD and ground;

$\gamma e_{T3}$ is the dynamic emitter impedance of T₃;

$U_T$ is the diffusion voltage; and $I_{ET3}$ is the emitter current of T₃.

The maximally permissible voltage gain of the amplifier V₃ is $$V_{max} = 1 + (C_E/C_{CB}),$$

where $C_{CB}$ is the capacity of the diode $D_{CB}$ and $C_E$ is the sum of the capacities at the summing point, comprising the input capacities of the amplifier V₁ connected to A and the capacity of the substrate diode $D_{CS}$. The resulting voltage $U_{CB}$ across the photo diode PD proper is given by $$U_{CB} = U_r - 0.7 \text{ V}.$$

For the case in which the polarities and doping conditions shown in FIG. 2 are used in the construction of the photo diode PD, it is advisable that the transistors T₁, T₂ and T₄ to T₆ be of the pnp type and the transistor T₃ of the npn type. If, on the other hand, the substrate is n-conducting, all doping conditions are reversed.

There are claimed:

1. Monolithically integrable semiconductor circuit with an amplifier controlled by a photo diode, comprising a differential amplifier having inverting and noninverting inputs and outputs and a photo diode having a first and a second lead, the first lead of said photo diode being connected in the blocking direction to the inverting input of said differential amplifier, and the noninverting input of said differential amplifier being connected to a reference potential, a coupling resistor connected between the inverting and noninverting inputs of said differential amplifier, a filter circuit and a transistor amplifier being connected in a feedback branch between the noninverting output and the inverting input of said differential amplifier, and the inverting output of said differential amplifier and the second lead of said photo diode being connected to ground.

2. Circuit according to claim 1 including a resistor connected between the inverting output of said differential amplifier and ground, and a resistor connected between the second lead of said photo diode and ground.

3. Circuit according to claim 1, wherein said filter circuit causes an attenuation in said feedback branch which is greater than the gain of said differential and transistor amplifiers disposed in said branch, for all useful signal frequencies.

4. Circuit according to claim 3, wherein said filter circuit is a lowpass filter.

5. Circuit according to claim 4, wherein said filter is a two-section lowpass filter.

6. Circuit according to claim 3, wherein said filter circuit is a band rejection filter with a rejection frequency corresponding to the transmission frequency.

7. Circuit according to claim 1, including an amplifier circuit, the anode of said photo diode being connected to the output of said amplifier circuit and the cathode of said photo diode being connected to the input of said amplifier circuit.

8. Circuit according to claim 7, wherein said amplifier circuit comprises identical first and second bipolar transistors of a given type, a third bipolar transistor of opposite type to said first and second transistor, a first and second current supply, and a current mirror amplifier, the cathode of said photo diode being connected to the base of said first transistor, the collector of said first transistor being connected to ground, the emitter of said first transistor being connected to said first current supply and to the base of said second transistor, the emitter of said second transistor being connected to said second current supply and to the base of said third transistor, the collector of said third transistor being connected to a control input of said current mirror amplifier, an output of said current mirror amplifier being fed back to the anode of said photo diode, and including a resistor connected between the emitter of said third transistor and the noninverting input of said differential amplifier.

9. Circuit according to claim 8, including an integrated circuit having a substrate and an epitaxial layer, said epitaxial layer containing said photo diode and having a conduction type opposite to that of said substrate, the emitter of said first transistor being connected antiparallel to said photo diode, having the same conduction type as said substrate, and said integrated circuit having no further pn-junction between the pn-junction intermediate said substrate and epitaxial layer and the pn-junction of said photo diode.

10. Circuit according to claim 2, wherein said resistor connected between the second lead of said photo diode and ground has a lower resistance than said coupling resistor.

* * * * *